United States Patent Office 3,640,992

Patented Feb. 8, 1972

3,640,992

NAPHTHOQUINONE DIAZIDE SULFONIC ACID ESTER

Oskar Sus and Fritz Uhlig, Wiesbaden-Beibrich, and Heinz Schafer, Wiesbaden-Sonnenberg, Germany, assignors to Kalle Aktiengesellschaft, Wiesbaden-Biebrich, Germany No Drawing. Filed June 5, 1967, Ser. No. 643,378

Claims priority, application Germany, July 27, 1966, K 59,885

Int. Cl. C07c *113/00;* G03c *1/52*

U.S. Cl. 260—141 1 Claim

ABSTRACT OF THE DISCLOSURE

This invention relates to a light-sensitive ester of a naphthoquinone diazide sulfonic acid and to a process for making the ester. The ester has enhanced solubility and is useful in photomechanical reproduction processes.

The present invention relates to a novel naphthoquinone diazide sulfonic acid ester, a process for the preparation of the ester, and a light-sensitive material containing the ester. The novel naphthoquinone diazide ester of the invention is prepared by condensing 1,2-naphthoquinone-diazide-(2)-4-sulfochloride with a phenol derivative in a suitable solvent. Cumyl phenol haviny the formula

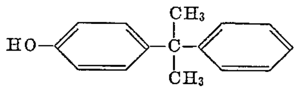

is used in the condensation as the phenol derivative. The process is performed analogously to the known processes in which naphthoquinone diazide sulfochloride is reacted with phenols. The same solvents are used, e.g. dioxane, acetone, methanol or ethanol, preferably diluted with water, and the known alkaline-acting substances are added as condensing agents, e.g. alkali hydroxide. The cumyl phenol used as the phenol component in the condensation is known and it is obtained, e.g., as a by-product in the preparation of phenol by decomposition of isopropyl benzene peroxides with the aid of acid catalysts. The recovery of the cumyl phenol produced as a by-product of this process is described in U.S. Pat. No. 2,750,426.

It is known to prepare naphthoquinone diazide sulfonic acid esters by condensing naphthoquinone diazide sulfochloride with phenol in a suitable solvent. The esters thus produced are light-sensitive compounds, many of which are suitable for use as light-sensitive substances in light-sensitive material for the preparation of copies by photomechanical means, and some have gained practical importance.

Further, it is known to be advisable to employ such esters, for light-sensitive material from which printing plates are to be produced, in which the phenol group has a high molecular weight, as compared with phenol itself, i.e. two or more times the weight of phenol. Although it is advantageous that, from such relatively high-molecular weight esters, solutions with only a small ester content can be prepared with most of the customary solvents, this drawback has normally been accepted, because the chemical stress on the material containing the light-sensitive esters during processing into a printing plate and, thereafter, during printing from the printing plate prepared from the material, obviously requires the ester to be of somewhat low solubility when long runs are desired from the printing plate.

It is also known to prepare the light-sensitive substance in the form of the naphthoquinone diazide sulfonamide, the amino group of which is substituted by an abietyl group available from colophony, in order to produce a light-sensitive substance which is soluble in conventional organic solvents. This light-sensitive naphthoquinone diazide sulfonamide is being used commercially, but it is less suitable for the preparation of printing plates from which long runs are to be made, because the printing plates wear too rapidly.

The light-sensitive naphthoquinone diazide compound which now has been found dissolves in organic solvents in larger quantities and, despite its good solubility, is suitable for the preparation of light-sensitive material from which long run printing plates are produced.

Accordingly, the object of the present invention is a novel naphthoquinone diazide sulfonic acid ester, viz the 1,2-naphthoquinone diazide-(2)-4-sulfonic acid ester of cumyl phenol.

Another object of the present invention is a process for the preparation of a naphthoquinone diazide sulfonic acid ester by condensing 1,2-naphthoquinone-diazide-(2)-4-sulfochloride with a phenol derivative in a suitable solvent, in which, in a manner hitherto unknown, cumyl phenol is used in the condensation process as the phenol derivative.

The present invention also provides a process for the preparation of a storable light-sensitive material suitable for the manufacture of reproduction by photomechanical means, in which a layer support is coated with a solution containing a cumyl phenol ester having the formula

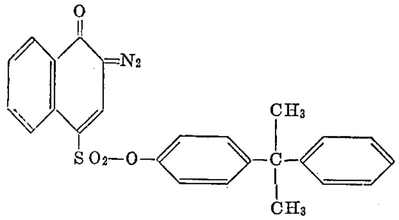

and the coated layer is dried. The process is performed in known manner and also may be modified in the usual respects. Thus, the surface of the support which is to be coated may be pre-treated in known manner, or a resin may be added to the solution of the light-sensitive substance to increase the abrasion resistance of the layer. The good solubility characteristics of the novel naphthoquinone diazide sulfonic acid ester may be utilized in this process in that less solvent is required in the application of a more concentrated solution, or a single coating of the solution produces a layer of a thickness which hitherto could be achieved only with two or three applications. When dissolved, e.g., in methylglycol of 20° C., the cumyl phenol ester yields solutions with a cumyl phenol ester content of at least 15 percent.

In practice, the sensitizing solutions employed for coating are sometimes used as much as several weeks after the preparation thereof, in particular when they are of a special type which are sold ready for use; the diazo compounds present in the solutions should have good solvent resistance. Often, it would be preferable to ship the solutions in the form of concentrates which would be diluted before use. The naphthoquinone diazide sulfonic acid ester obtained according to the present invention has high stability and is more readily soluble than are the other light-sensitive naphthoquinone diazide compounds of comparable performance.

Because of the excellent storability of the novel substance and because of the good solubility thereof in organic solvents, the new compound is particularly suitable for the preparation of photographic stencils requiring thick layers, as used, e.g., for the production of printed circuits. Further, presensitized material in which a light-sensitive layer containing this compound has been applied to metal supports, e.g. aluminum or zinc, as also to paper or plastic films, possesses excellent storage properties. The novel compound also is used with advantage as a light-sensitive substance on multi-layer supports, e.g. multi-metal supports or plastic films which have been provided with a metallic layer by laminating or vacuum-deposition of an aluminum, copper, silver, chromium, or other metallic layer.

Furthermore, it is of advantage that the process for the preparation of the new compound yields a uniform end product. This is in contradistinction to processes in which a compound is used as the phenol component which contains several esterifiable hydroxyl groups, not all of which, however, are to be esterified. Hitherto, such processes have been prefererd in order to achieve a long press life for the printing plates prepared. The disadvantage that it is difficult to produce such partially esterified compounds in a uniform composition and, as a consequence thereof, the risk that products of non-uniform photomechanical properties might be obtained, previously had to be accepted.

The invention will be further illustrated by reference to the following specific examples:

EXAMPLE 1

540 g. of 2-diazo-1-naphthol-4-sulfochloride are dissolved in 4.5 liters of dioxane and, to this mixture, a solution of 424 g. of cumyl phenol and 80 g. of caustic soda in 1.4 liters of water and 0.5 liter of dioxane is added over a period of 3 hours at room temperature (about 20° C.) and while agitating; the temperature rises to about 30° C. Stirring is continued for 2 hours and part of the ester precipitates. By adding 3 liters of ice water, any ester still in solution is also precipitated. The crude product is separated by suction filtration and for purification, the filtration residue is thoroughly stirred for 1 hour with 1.5 liters of ethanol at an internal temperature of 65° C., the ester remaining practically undissolved. The mass is then allowed to cool to about 20° C., with stirring, and then is filtered by suction. In order to remove any liquid remaining in the residue, it is pressed in a screw press and then dried at about 40° C. After recrystallization of the crude product, by dissolving it in a mixture of acetone and ethanol and then reprecipitating it by adding hot water, light-yellow crystals of a melting point of 133° C. (with decomposition) are obtained. Yield: 790 g.=89% of the theoretical.

EXAMPLE 2

1.8 g. of the cumyl phenol ester of 1,2-naphthoquinone diazide-(2)-4-sulfonic acid, prepared as described in Example 1, and 5.0 g. of a novolak are dissolved in 100 ml. of glycol monoethylether. The solution is then coated upon a mechanically roughened aluminum foil placed on a rotating plate whirler. The foil is then dried in a current of warm air.

When using the sensitized foil thus produced, it is exposed under a master, e.g. for 1 minute to a 18 amp. carbon arc lamp at a distance of 70 cm., and developed by wiping over with an aqueous solution containing 2.4 g. of $Na_3SiO_3 \cdot 9H_2O$ and 1.8 g. of $Na_3PO_4 \cdot 12H_2O$ in 100 ml. of water, using a sponge or a cotton pad. The image becomes visible in a yellow color on a metallic background. After rinsing with water, the plate is inked up with greasy ink and then may be used in a printing machine for printing many thousands of copies.

EXAMPLE 3

A degreased zinc plate is coated, on a plate whirler, with a solution of 3.0 g. of the diazo compound prepared as described in Example 1, 30 g. of a phenol-formaldehyde resin (sold by Chemische Werke Albert, Wiesbaden-Biebrich, under the designation "Alnovol 429 K"), and 0.5 g. of Methyl Violet 6B (Schultz' Farbstofftabellen, Vol. I, 7th Edition, page 330, No. 786) in a mixture made up of 95 ml. of ethylglycol and 5 ml. of dimethylformamide, and the coated plate is then dried by means of a current of warm air. For complete removal of the solvent, the sensitized plate is then dried for 5 minutes at 100° C. in a drying oven.

When using the presensitized material thus produced, it is exposed for 6 minutes under a transparent continuous tone positive, using a tubular lamp having an intensity of 1800 to 2000 lux units as the light source, and developed with the developer solution used in Example 2 in which the exposed material is bathed for 2 minutes at 22° C. From a positive master a positive printing form is obtained which exhibits strongly blue-violet colored screen dots on a metallic background. For the preparation of a relief printing plate, the image produced is first superficially etched with a 0.5 percent nitric acid solution and then deep-etched in the normal manner, e.g. by means of a 7 to 8 percent nitric acid solution.

EXAMPLE 4

3 g. of the naphthoquinone-(1,2)-diazide-(2)-4-sulfonic acid cumyl phenol ester, prepared as described in Example 1, and 10 g. of m-cresol-formaldehyde resin novolak are dissolved in 100 ml. of glycol monoethylether, 0.5 g. of Methyl Violet BB (Schultz' Farbstofftabellen, 7th Edition, Vol. I (1931), page 327, No. 738) is added, the solution is filtered, and then is coated onto a copper foil of about 30–70$\mu$ thickness which has been laminated to a dielectric plastic plate, e.g. a plate of hardened phenol-formaldehyde resin.

After exposure of the light-sensitive material under a positive transparency, showing a wiring diagram, and removal of the parts of the layer not affected by light by treatment with an about 2.5 percent trisodium phosphate solution containing 10 to 15 percent by volume of glycol monoethylether, the copper/plastic plate is rinsed with water and dried with hot air. Then, the copper layer in the bared areas is removed by etching with an iron chloride solution of 40° Bé. at room temperature (20–22° C.). So-called "printed circuits" for conducting electric current are thus obtained which are particularly suitable for use as structural elements in electrical apparatus.

EXAMPLE 5

A transparent, dimensionally stable polyterephthalic acid glycol ester film with an aluminum layer laminated thereto is coated, on the metallic surface, with the solution described in Example 2 above. The light-sensitive material thus obtained is exposed under a master and developed as described in Example 2, with the exception that a negative master is used for exposure. By treatment with an aqueous solution containing 45 percent by weight of ferric nitrate and 5 percent by weight of calcium acetate, the metal layer is dissolved away from the polyterephthalic acid glycolester film in the areas bared during the developing process. After rinsing with water and drying, the residual portions of the light-sensitive layer are removed by an over-all exposure of the surface and wiping with the developer employed in the preceding example.

The entire surface is now wiped over with greasy ink, the ink adhering only to the bared areas of the film, while the aluminum-covered areas repel the greasy ink.

EXAMPLE 6

2 g. of the diazo compound prepared as described in Example 1, 0.5 g. of polyvinyl acetate having a molecular weight of about 2,000,000, and 5 g. of a phenol-formaldehyde novolak are dissolved in 992.5 g. of methylglycol, and the solution thus produced is coated on the chromium surface of an aluminum/copper/chromium trimetal plate on a plate whirler and then dried by heating.

After exposure under a photographic negative, the trimetal plate is converted into a printing plate by developing it, in known manner, with an alkaline solution, etching it with an etching solution for chromium layers, removing the still light-sensitive layer in the image-free areas by means of an organic solvent, and inking the image areas with greasy ink. The printing plate thus produced is suitable for printing in an offset printing machine.

EXAMPLE 7

3 g. of the diazo-compound prepared as described in Example 1 and 10 g. of a phenol-formaldehyde novolak are dissolved in a mixture made up of 80 ml. of ethylglycol acetate, 10 ml. of xylene, and 10 ml. of butylacetate, and the copper surface of a bimetal plate consisting of aluminum and copper layers is coated with this solution on a plate whirler.

After exposure under a photographic diapositive, a printing form is prepared by developing the plate, in known manner, with an alkaline solution and then dissolving the copper bared in the non-image areas by means of an etching solution for copper layers (the solution containing 45% of $Fe(NO_3)_2$ and 5% of calcium acetate in water) until the underlying aluminum becomes distinctly visible. The plate is wetted with a 1 percent aqueous phosphoric acid solution and then wiped over with greasy ink, the greasy ink being accepted by the image areas and repelled by the bared aluminum areas. The printing plate is now ready for printing.

EXAMPLE 8

1 g. of the diazo compound prepared as described in Example 1 and 2 g. of Zapon Fast Blue HFL (Color Index, Part I, 2nd Edition 1956, page 2880) are dissolved in 100 ml. of methylglycol, and the solution thus produced is then coated onto the surface of a web of 100μ thick polyester film.

After drying in a heating channel, the web is cut into sheets. In the absence of light, these presensitized sheets can be stored for many months without an appreciable loss of light-sensitivity.

For the preparation of a registration guide for multicolor printing, one of the blue-colored sheets of film is exposed for about 3 minutes under a screened color separation silver halide film prepared in a reproduction camera with the aid of a filter, using a 60 amp. carbon arc lamp at a distance of 110 cm. as the light source. By wiping with a cotton pad soaked in an aqueous solution containing 2.4% of sodium silicate, 1.5% of sodium triphosphate, and 0.3% of sodium dihydrogen phosphate, the layer is removed from the image-free areas. After rinsing with water and drying, a blue-colored image of the original is obtained which carries the usual register marks. Now the yellow separation silver film original produced under a yellow filter in the camera is placed on the blue registration sheet in register therewith, i.e. the register marks and the edges of the two sheets being superimposed, and the two sheets are fastened to each other. The assembly is now placed upon a light-sensitive printing plate and exposed by means of an arc lamp. After the usual development and inking of the printing plate, it may be used for printing with yellow printing ink in one of the customary multicolor printing machines.

The assembly, consisting of the blue registration sheet and the yellow separation original, is now taken apart, and a red separation silver film original is fastened to the blue registration sheet analogously, and a further printing plate made from which prints can be made in red ink on a printing machine.

In the same manner, the blue registration sheet serves as a registration guide or montage aid for the blue separation silver film original, and, in the case of four-color printing, also for the (black) diapositive of the multi-colored original which is prepared without using a color filter.

EXAMPLE 9

7 g. of the ester prepared as described in Example 1, 9 g. of a propyleneglycol-1:1-maleic acid isophthalic acid polyester with an acid number of 30–40 (commercially available under the trade name "Marco MR-37"), and 9 g. of a para-substituted alkylphenol formaldehyde condensate (commercially available under the trade name "Schenectady Resin SP 134") are dissolved in a solvent mixture consisting of 57 ml. of ethylglycol acetate, 7 ml. of butyl acetate, and 7 ml. of xylene. The solution thus obtained may be stored for many months. It is used either undiluted or after suitable dilution with the above mentioned solvent mixture. For instance, a copper foil laminated to a dielectric plastic plate was sensitized with the undiluted solution. Exposure, development and etching of the plate for the preparation of a "printed circuit" were performed as described in Example 4.

EXAMPLE 10

4 g. of the ester prepared as described in Example 1 are dissolved in a mixture of 80 g. of ethyleneglycol monomethylether and 20 g. of butyl acetate, and a mechanically roughened aluminum foil is sensitized by means of this solution. After drying, the foil is exposed under a photographic diapositive and developed by wiping with a 0.25 percent aqueous solution of trisodium phosphate. It is then rinsed with water and inked up with greasy ink. The printing form thus produced may be used for printing several thousands of prints in an offset printing machine.

It will be obvious to those skilled in the art that many modifications may be made within the scope of the present invention without departing from the spirit thereof, and the invention includes all such modifications.

What is claimed is:

1. A compound having the formula

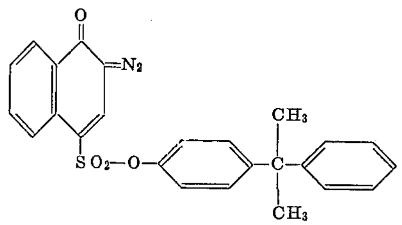

References Cited

UNITED STATES PATENTS

| | | | |
|---|---|---|---|
| 2,767,092 | 10/1956 | Schmidt | 260—141 X |
| 3,046,121 | 7/1962 | Schmidt | 260—141 X |
| 3,050,389 | 8/1962 | Sus | 260—141 X |
| 3,061,430 | 10/1962 | Uhlig et al. | 260—141 X |
| 3,188,210 | 6/1965 | Fritz et al. | 260—141 X |

FLOYD DALE HIGEL, Primary Examiner

U.S. Cl. X.R.

96—33, 75, 91 D; 317—101 B, 101 C